(12) United States Patent
Ratnakumar

(10) Patent No.: US 7,869,279 B1
(45) Date of Patent: Jan. 11, 2011

(54) EEPROM MEMORY DEVICE AND METHOD OF PROGRAMMING MEMORY CELL HAVING N ERASE POCKET AND PROGRAM AND ACCESS TRANSISTORS

(75) Inventor: Kola Nirmal Ratnakumar, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 117 days.

(21) Appl. No.: 12/176,236

(22) Filed: Jul. 18, 2008

Related U.S. Application Data

(63) Continuation of application No. 11/696,095, filed on Apr. 3, 2007, now abandoned.

(51) Int. Cl.
*G11C 11/34* (2006.01)
*H01L 29/788* (2006.01)

(52) U.S. Cl. .............. 365/185.18; 365/185.19; 365/185.26; 365/185.29; 365/185.3; 257/296; 257/315; 257/316; 257/390; 257/681; 257/E21.68; 257/E21.684; 257/E21.69; 257/E21.687; 257/E27.103

(58) Field of Classification Search ............ 257/296, 257/315, 316, 390, 681, 684, E21.68, E21.684, 257/E21.67, E21.69, E27.103; 365/185.18, 365/185.19, 185.3, 185.26, 185.29
See application file for complete search history.

(56) References Cited

U.S. PATENT DOCUMENTS 7,436,710 B2 * 10/2008 Ratnakumar et al. ... 365/185.18
2008/0273392 A1 * 11/2008 Ratnakumar et al. ... 365/185.19

* cited by examiner

*Primary Examiner*—Dao H Nguyen
(74) *Attorney, Agent, or Firm*—Fountain Law Group, PLC

(57) ABSTRACT

A memory device including a plurality of memory cells, each with access and program PMOS transistors situated in a common N-Well formed in a P-substrate, and an n-erase pocket formed directly in the P-substrate. Each cell includes a program PMOS including gate, and first and second P+ regions formed in an N-Well, wherein the first P+ region is electrically connected to a corresponding bit line. Each cell further comprises an access PMOS including a gate, and first and second P+ regions formed within the same n-doped well as the first and second P+ regions of the program PMOS, wherein the first P+ region is electrically connected to the second P+ region of the program PMOS, and the gate is electrically connected to a corresponding word line. Each cell further includes an n-doped erase pocket including gate, and first and second N+ regions electrically connected to a corresponding erase line, and the gate is electrically connected to the gate of the program PMOS, forming the floating gate of the cell. The program and access PMOS of cells common to a bit line may be formed in a continuous N-Well. The first and second N+ regions of the n-doped erase pocket can be shorted by a substantially uniformly doped diffusion region.

16 Claims, 8 Drawing Sheets

| Operation | Program | Read | Block Erase | Sector Erase | Bit/Byte Erase |
|---|---|---|---|---|---|
| Selected Bit Line | 0V | Vcc | 0V | 0V | 0V |
| Unselectd Bit Line | Float | Float | 0V | 0V | Vinh |
| Selected Word Line | 0V | 0V | N/A | N/A | Vinh |
| Unselected Word Line | Vprog | Vcc | N/A | N/A | Vinh |
| Varray | Vprog | Vread | 0V | 0V | Float |
| Selected Erase Line | Vassist | Vcc | Verase | Verase | Verase |
| Unselected Erase Line | Vassist | Vcc | Verase | 0V | 0V |
| Selected NWell | Vprog | Vcc | 0V | 0V | 0V |
| Unselected NWell | Vprog | Vcc | 0V | 0V | Vinh |

EEPROM MEMORY DEVICE AND METHOD OF PROGRAMMING MEMORY CELL HAVING N ERASE POCKET AND PROGRAM AND ACCESS TRANSISTORS

CROSS-REFERENCE TO RELATED APPLICATIONS

The present application is a continuation of patent application Ser. No. 11/696,095, filed on Apr. 3, 2007 entitled, "EEPROM MEMORY DEVICE WITH CELL HAVING N ERASE POCKET AND PROGRAM AND ACCESS TRANSISTORS IN A COMMON WELL", which is incorporated herein by reference.

FIELD OF THE INVENTION

This invention relates generally to electrical erasable programmable read only memory (EEPROM) devices, and in particular, to an EEPROM device comprising an array of cells each having an N type erase pocket, and program and access transistors in a common well.

BACKGROUND OF THE INVENTION

Electrical erasable programmable read only memory (EEPROM) devices are continuously being developed to provide improved characteristics. Some of these developments include improving the ease of manufacturing the device; adding new improvements without significantly compromising the manufacturing process of the device; increasing the density of the memory cells of the device to provide higher memory capacity for a given integrated circuit (IC) chip area; improving the reliability of the device to improve data retention and extend erase and programmable life span; improving the program efficiency and flexibility of the device to achieve lower programmable voltages and currents, and provide bit, byte, sector, and array programming of memory cells; and improving the erase efficiency and flexibility of the device to similarly achieve lower erase voltages, and provide bit, byte, sector, and/or array erasing of memory cells.

In particular, for applications involving embedded non-volatile memory elements, single poly EEPROMs with minimal or no added steps to a standard CMOS process is preferred because of lower cost, minimal process complexity and negligible impact on the performance of other devices.

In the past, EEPROM devices have had shortcomings with respect to at least some of these characteristics. For instance, their memory cell structure and layout are generally inefficient resulting in relatively large memory cell size, relatively low data retention, limited erasing and programming life span, relatively high programming voltages and currents, and relatively high erase voltages. These shortcomings are better explained below with reference to a particular conventional EEPROM device.

FIG. 1A illustrates a schematic diagram of an exemplary conventional EEPROM device 100. In this example, the EEPROM device 100 is shown to include an array of four (4) memory cells 102a-d for illustrative purposes. However, it is well known that typical EEPROM devices include arrays with much more memory cells (e.g., $10^3$-$10^6$ memory cells, or higher). In this example, memory cells 102a and 102b share word line WL1, and memory cells 102c and 102d share word line WL2. Also, memory cells 102a and 102c share bit line BL1, and memory cells 102b and 102d share bit line BL2. In this example, the memory cells 102a-d are formed in and on a p-doped substrate (P-substrate) 104.

Each memory cell (102a-d) consists of an erase p– channel metal oxide semiconductor (PMOS) transistor (110a-d), a program PMOS transistor (114a-d), and an access n-doped channel metal oxide semiconductor (NMOS) transistor (118a-d). Each erase PMOS transistor (110a-d) is formed in a separate n-doped well (N-Well) (112a-d) formed in the P-substrate 104. Each program PMOS transistor (114a-d) is also formed in a separate N-Well (116a-d) in the P-substrate 104. Each access NMOS transistor (118a-d) is formed in a separate p-doped well (P-Well) (120a-d) formed in the P-substrate 104.

The sources (S), drains (D), and N-Wells 112a-b of the erase PMOS transistors 110a-b of memory cells 102a-b are respectively electrically connected together, and connected to Erase Line 1. Similarly, the sources (S), drains (D), and N-Wells 112c-d of the erase PMOS transistors 110c-d of memory cells 102c-d are respectively electrically connected together, and connected to the Erase Line 2. The sources (S) and N-Wells 116a and 116c of the program PMOS transistors 114a and 114c of the memory cells 102a and 102c are electrically connected to the bit line BL1. Similarly, the sources (S) and N-Wells 116b and 116d of the program PMOS transistors 114b and 114d of memory cells 102b and 102d are electrically connected to the bit line BL2. The gate of each of the PMOS erase transistor (110a-d) is electrically connected to the gate of the corresponding program PMOS transistor (114a-d), which forms the floating gate (FG) for the memory cell (102a-d).

The drain (D) of each program PMOS transistor (114a-d) is electrically connected to the drain (D) of the corresponding access NMOS transistor (118a-d). The sources (S) of the access NMOS transistors 118a-d are electrically connected to ground potential (Gnd). The gates (G) of the access NMOS transistors 118a-b of memory cells 102a-b are electrically connected to the word line WL1. The gates (G) of the access NMOS transistors 118c-d of memory cells 102c-d are electrically connected to the word line WL2.

FIG. 1B illustrates a layout of the exemplary conventional memory cell 102a. The layout of the memory cell 102a is typically the same for the other memory cells 102b-d of the EEPROM device 100. As shown, the source (S) and drain (D) of the erase PMOS transistor 110a, in addition to being electrically connected together and to the Erase Line 1, are connected to the N-well 112a via a highly n-doped contact 111a. The source (S) of the program PMOS transistor 114a, in addition to being connected to the bit line BL1, is connected to the N-Well 116a via a highly n-doped contact 115a. Also, the drain (D) of the access NMOS transistor 118a, in addition to being electrically connected to ground potential, is connected to the P-Well 120a via a P+ contact 119a.

FIG. 1C illustrates a schematic cross-section of the erase PMOS transistor 110a and program PMOS transistor 114a of the conventional EEPROM device 100. As shown, the sources (S) and drains (D) of both the erase and program PMOS transistors 110a and 114a comprise a P+ contact region adjacent to a lighter P-doped region within the channel. The lighter P-doped region is typically employed to prevent avalanche breakdown due to high electric fields along the edges of the source (S) and drain (D) regions.

As discussed above, the conventional EEPROM device 100 has some shortcomings with regard to memory cell density, reliability, programming and erasing characteristics. For example, with regard to memory cell density, the memory cell includes separate N-Wells for the erase and program PMOS transistors. In addition, the spacing between the adjacent N-Wells is relatively large to ensure proper electrical isolation. Further, the memory cell includes a relatively large NMOS access transistor, in a separate P-Well, to carry the relatively large voltage and current needed for programming the cell. These factors result in a memory cell occupying a relatively large chip area, which makes it difficult to provide higher memory cell density for this type of EEPROM device.

With regard to reliability, the large floating gate (FG) including the erase and program PMOS transistors results in a relatively large area, which allows greater large current leakage. This adversely affects the data retention capability of the conventional EEPROM device. Because of the relatively large floating gate area, larger voltages and currents are generally needed for programming the memory cells. The relatively large program voltages also generally have an adverse effect on the programmable lifespan. Additionally, higher erase voltages are needed for erasing the memory cells.

SUMMARY OF THE INVENTION

An aspect of the invention relates to a memory device, such as an electrical erasable programmable read only memory (EEPROM) device. The memory device comprises a p-doped substrate, a plurality of electrically-conductive bit lines extending along a bit line direction, a plurality of electrically-conductive word lines extending along a word line direction, a plurality of electrically-conductive erase lines extending along the word line direction, and a plurality of memory cells arranged along the bit and word lines.

Each memory cell, in turn, comprises a program PMOS transistor including a gate, and first and second P+ regions formed within an n-doped well, wherein the first P+ region of the program PMOS transistor is electrically connected to a corresponding bit line. Each memory cell further comprises an access PMOS transistor including a gate, and first and second P+ regions formed within the same n-doped well as the first and second P+ regions of the program PMOS transistor. The first P+ region of the access PMOS transistor is electrically connected to the second P+ region of the program PMOS transistor. The gate of the access PMOS transistor is electrically connected to a corresponding word line. Each memory cell further comprises an n-doped erase pocket including a gate, and first and second N+ regions electrically connected to a corresponding erase line. The gate of the n-doped erase pocket is electrically connected to the gate of the program PMOS transistor, both serving as the floating gate of the memory cell.

In the exemplary embodiment, the program and access PMOS transistors of memory cells common to a bit line may be formed in a continuous n-doped well. Also, the n-doped erase pocket may be configured such that its first N+ region is electrically connected to its second N+ region by way of an electrically-conductive layer (e.g., metal) formed above the p-doped substrate. Alternatively, the n-doped erase pocket may be configured such that its first N+ region is electrically connected to its second N+ region by way of a substantially uniformly doped diffusion region. The n-doped erase pocket may be formed directly in the p-doped substrate, instead of in a p-doped well. The memory device may include a plurality of electrically-conductive bias lines (V_Array) extending along the word line direction, and electrically-connected to the second P+ region of the access PMOS transistors of memory cells common to respective word lines.

Another aspect of the invention relates to a method of programming a selected memory cell. In this case, the method applies to a memory cell comprising a selected program PMOS transistor, a selected access PMOS transistor connected in series with the program PMOS transistor, and a selected n-doped erase pocket sharing a floating gate with the said PMOS transistor. The method comprising applying a substantially ground potential to a drain of the selected program PMOS transistor, applying a substantially ground potential to a gate of the selected access transistor, and applying a bias voltage (e.g., 3-6 V) to the source of the selected access transistor. The method may further include applying another voltage (e.g., 0-3 V) to the selected erase line to minimally turn on the erase n-pocket to improve the efficiency of programming the selected PMOS transistor. The method may further include biasing of unselected memory cells to reduce the disturbance of stored data therein while programming the selected memory cell.

Another aspect of the invention method relates to a method of reading a selected memory cell. In this case, the method applies to a memory cell comprising a selected program PMOS transistor, a selected access PMOS transistor connected in series with the program PMOS transistor, and a selected n-doped erase pocket sharing a floating gate with the program PMOS transistor. The method comprises applying a first bias voltage (e.g., 2-4 V for a typical supply voltage of 3V) to a source of the selected program PMOS transistor, applying a substantially ground potential to a gate of the selected access transistor, and applying a second bias voltage (e.g., 1-3.5 V) to a drain of the selected access transistor. The method may further include applying another voltage (e.g., 2-4 V) to the selected erase line to improve the efficiency of reading the selected PMOS transistor. The method may further include biasing of unselected memory cells to reduce the disturbance of stored data therein while reading the selected memory cell.

Another aspect of the invention relates to a method of erasing a block, sector, byte, or bit of memory cell(s). In this case, the method applies to a memory cell comprising a program PMOS transistor, an access PMOS transistor connected in series with said program PMOS transistor, and an n-doped erase pocket sharing a floating gate with said program PMOS transistor. The method comprises applying a substantially ground potential to a first P+ region of each program PMOS transistor, and applying a bias voltage to first and second N+ regions of each n-doped erase pocket. The method may further include biasing of unselected memory cells to reduce the disturbance of stored data therein while erasing the selected memory cell(s).

If the byte erase operation is not needed, the array can be simplified by connecting all the N-Wells in the array to a global N-Well bias terminal because the selected and unselected N-Wells are at the same potential for all other Program, Read and Erase operations.

Other aspects, advantages and novel features of the present invention will become apparent from the following detailed description of the invention when considered in conjunction with the accompanying drawings.

BRIEF DESCRIPTION OF THE DRAWINGS

FIG. 2D illustrates a table depicting exemplary operation voltages for the exemplary EEPROM device in accordance with an embodiment of the invention;

DETAILED DESCRIPTION OF THE EXEMPLARY EMBODIMENTS

Figure 1A:
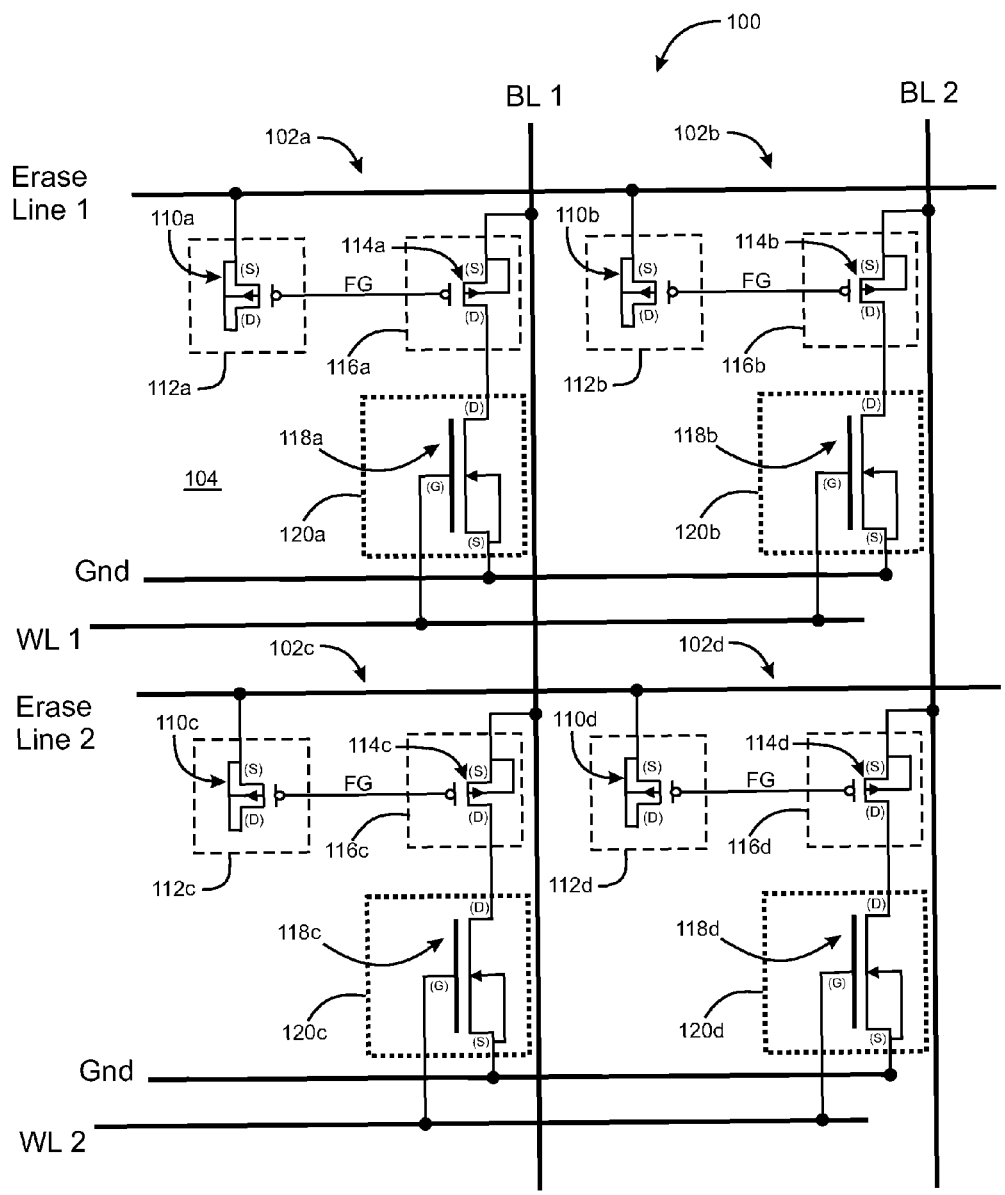
FIG. 1A illustrates a schematic diagram of an exemplary conventional EEPROM device.
Figures 1B, 1C:
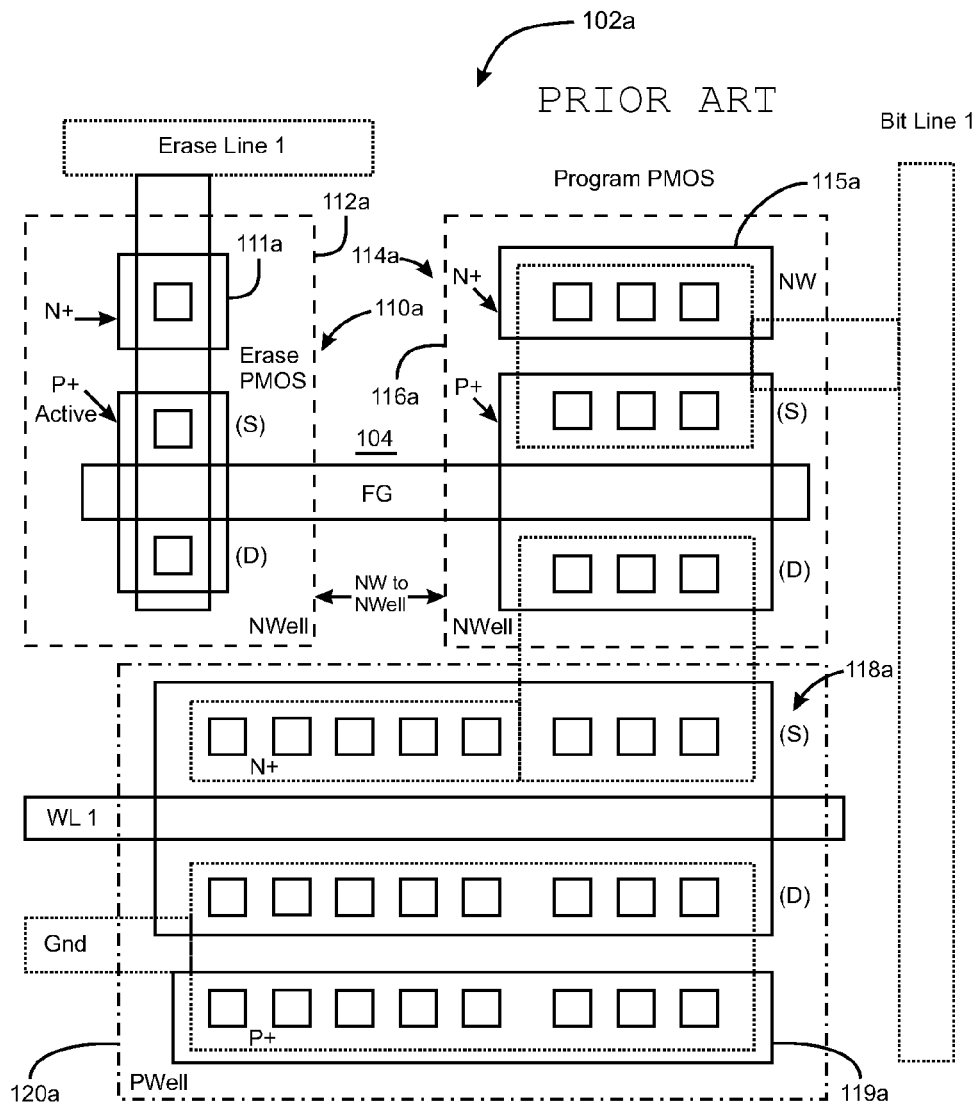
FIG. 1B illustrates a layout of the exemplary memory cell of the conventional EEPROM device.
FIG. 1C illustrates a schematic cross-section of the conventional erase and program PMOS transistors of the conventional EEPROM device.
Figure 2A:
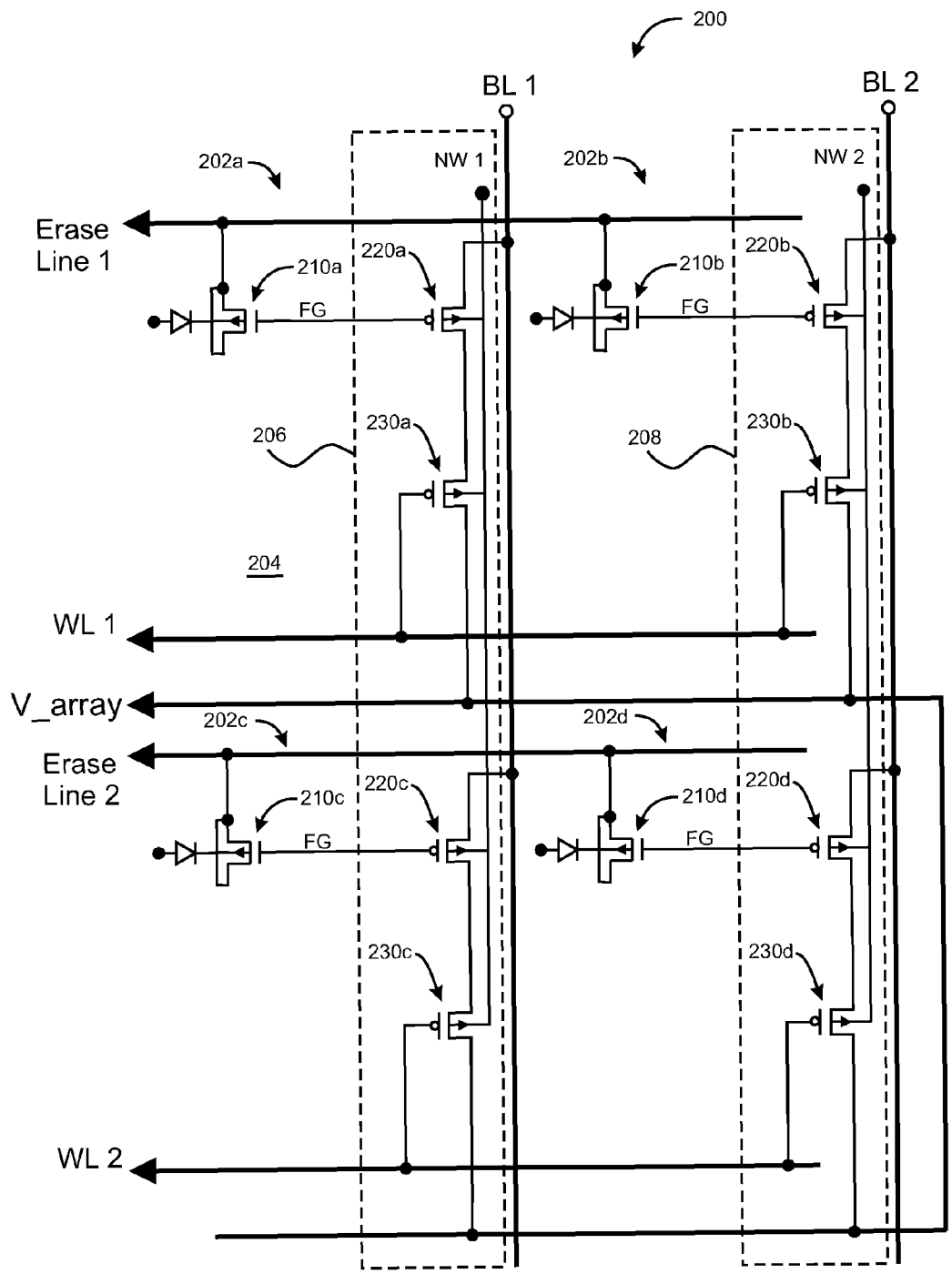
FIG. 2A illustrates a schematic diagram of an exemplary EEPROM device in accordance with an embodiment of the invention.

FIG. 2A illustrates a schematic diagram of an exemplary electrically erasable programmable read only memory (EEPROM) device 200 in accordance with an embodiment of the invention. In the exemplary embodiment, the EEPROM device 200 is shown to comprise an array of four (4) memory cells 202a-d. However, it shall be understood that the exemplary EEPROM device 200 may include an array with substantially more memory cells (e.g., $10^3$-$10^6$ memory cells, or higher). In this example, memory cells 202a-b share the same word line WL1, and memory cells 202c-d share the same word line WL2. Also, memory cells 202a and 202c share the same bit line BL1, and memory cells 202b and 202d share the same bit line BL2. In this example, the memory cells 202a-d are formed in and on a p-doped substrate (P-substrate) 204.

Each memory cell (202a-d) comprises an n-doped erase pocket (210a-d), a program p-doped channel metal oxide semiconductor (PMOS) transistor (220a-d), and an access PMOS transistor (230a-d). The program PMOS transistor and access PMOS transistor of each memory cell common to a bit line are formed in the same n-doped well (N-Well). Accordingly, program PMOS transistors 220a and 220c, and access PMOS transistors 230a and 230c, of memory cells 202a and 202c, respectively, are formed within N-Well 206 in the P-substrate 204. Similarly, program PMOS transistors 220b and 220d, and access PMOS transistors 230b and 230d, of memory cells 202b and 202d, respectively, are formed within N-Well 208 in the P-substrate 204. In this example, each N-erase pocket (210a-d) is formed directly in the P-substrate 204, and not within a well.

In the exemplary embodiment, each N-erase pocket (210a-d) is configured into an NMOS transistor having a drain (D) and source (S) region electrically connected together, and to the erase line (Erase Lines 1-2) along the same word line via an electrically-conductive layer (e.g., a metal layer). The gate of each N-erase pocket (210a-d) is electrically connected to the gate of the corresponding program PMOS transistor (220a-d) via an electrically-conductive layer (e.g., doped or silicided polysilicon over field oxide), to form the floating gate (FG) for the corresponding cell (202a-d). As discussed in more detail below with reference to FIG. 2C, the channel of each N-erase pocket (210a-d) is n-doped to form essentially a p-n junction (symbolized in the drawing as a diode) between the p-substrate 204 and the channel of the N-erase pocket (210a-d).

In the exemplary embodiment, each program PMOS transistor along a bit line includes a first P+ region (drain or source) electrically connected to the corresponding bit line via an electrically-conductive layer. For example, the first P+ regions of program PMOS transistors 220a and 220c are connected to bit line BL1. Similarly, the first P+ regions of program PMOS transistors 220b and 220d are connected to bit line BL2. Each program PMOS transistor (220a-d) includes a second P+ region (source or drain) electrically connected to a first P+ region (drain or source) of each access PMOS transistor (230a-d). The second P+ region of each program/erase PMOS transistor (220a-d) and the first P+ region of the access PMOS transistor may be combined into a single P+ region as shown in FIG. 2C.

Each access PMOS transistor (230a-d) includes a second P+ region (source or drain) electrically connected to a bias line V_array via an electrically conductive layer. The gate (G) of each access PMOS transistor is electrically connected to the corresponding word line. For example, the gates (G) of access PMOS transistors 230a-b are electrically connected to the word line WL1. Similarly, the gates (G) of access PMOS transistors 230c-d are electrically connected to the word line WL2.

A bias connection for each N-well along a bit line is provided for biasing the corresponding N-Well. This permits biasing of the selected N-Well 206 to a voltage different from the bias of unselected N-Well 208, if necessary.

As discussed in more detail below, during programming, the first P+ regions of the program and access PMOS transistors serve as the respective drains of the devices, and the second P+ regions of the program and access PMOS transistors serve as the respective sources of the devices. During reading, the first P+ regions of the program and access PMOS transistors serve as the respective sources of the devices, and the second P+ regions of the program and access PMOS transistors serve as the respective drains of the devices.

Figure 2B:
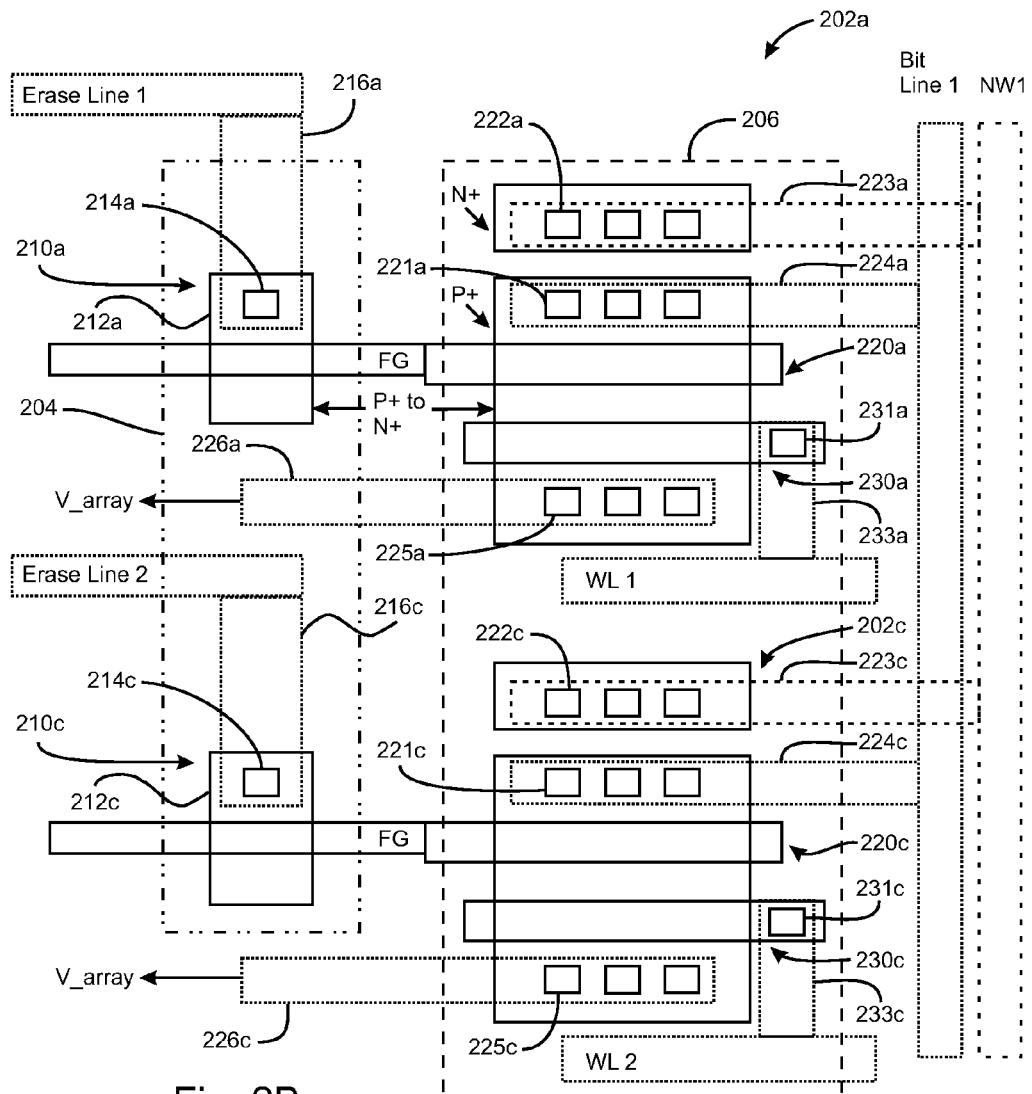
FIG. 2B illustrates a layout of exemplary memory cells along a common bit line of the exemplary EEPROM device in accordance with an embodiment of the invention.
Figure 2C:
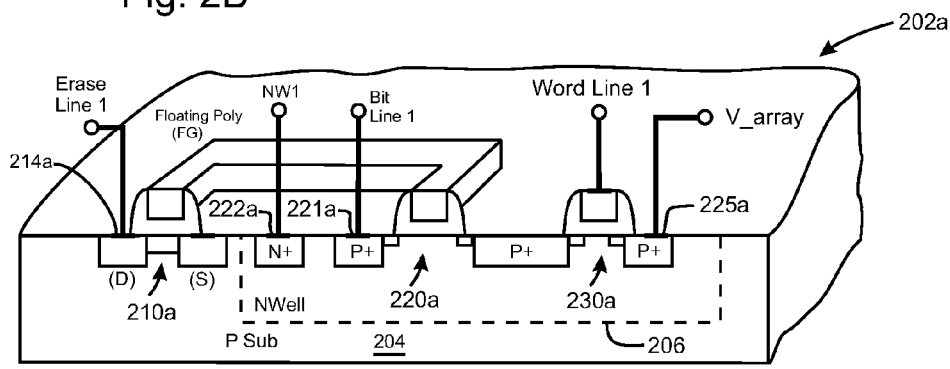
FIG. 2C illustrates a schematic cross-section of the exemplary memory cell in accordance with an embodiment of the invention.

FIG. 2B illustrates a layout of exemplary memory cells 202a and 202c along a common bit line BL1 of the exemplary EEPROM device 200 in accordance with an embodiment of the invention. As shown, the N-erase pocket 210a comprises an n-doped channel 212a including a highly doped (N+) contact 214a. The Erase Line 1, which could be an electrically-conductive layer (e.g., metal), is electrically coupled to the channel 212a of the N-erase pocket 210a via an electrically-conductive layer 216a and the contact 214a. The floating gate (FG), may be comprised of an electrically-conductive layer (e.g., doped or silicided polysilicon), which extends from at least the channel of the N-erase pocket 210a to at least the channel of the program PMOS transistor 220a. It is to be understood that the regions outside of the active or thin oxide regions marked by N+ and P+ on FIGS. 2B and 2C may be filled with thick field oxide for electrical isolation.

As shown, the program PMOS transistor 220a comprises a first P+ region including one or more highly-doped (P+) contacts 221a formed within the N-Well 206. The first P+ region contacts 221a are electrically connected to the bit line 1 via an electrically-conductive layer 224a. The N-Well 206 containing the program PMOS transistor 220a includes one or more highly-doped (N+) contacts electrically connected to the N-Well bias line NW1 via an electrically-conductive layer 223a. The access PMOS transistor 230a includes one or more drain contacts (P+ doped contacts) 225a electrically connected to an electrically-conductive layer 226a forming the bias line V_array. The gate (G)) of the access PMOS transistor 230a is electrically connected to the word line WL1 via a contact 231a and an electrically-conductive layer 233a. All other memory cells may be similarly structured as memory cell 202a, such as memory cell 202c having the same elements but designated with a "c" suffix.

FIG. 2C illustrates a schematic cross-section of the memory cell 202a of the exemplary EEPROM device 200 in accordance with an embodiment of the invention. As shown, the memory cell 202a includes the N-erase pocket 210a formed in the P-substrate 204, and including an n-doped channel interposed between higher n-doped drain (D) and source (S) regions. As discussed above, the Erase Line 1 is electrically coupled to the drain (D) region via the contact 214a. Since the source(S) and drain (D) are electrically connected together, it shall be understood that the Erase Line 1 may alternatively be connected directly to the source (S) region. As shown, the floating gate (FG), which may be an electrically-conductive layer (e.g., doped polysilicon) disposed on top the P-substrate 204, extends from the channel of the N-Erase pocket 210a to the channel of the program PMOS transistor 220a.

The program PMOS transistor 220a includes a channel interposed between highly P-doped (P+) regions. The P+ regions of the program PMOS transistor 220a may respectively include lighter p-doped regions on the channel side to prevent avalanche breakdown due to high electric fields associated with the edges of the P+ regions. The first P+ region of the program PMOS transistor 220a is electrically coupled to the bit line BL1 via a contact 221a. The N-Well 206 is coupled to the NW1 bias line via a contact 222a to prevent a forward biasing of the P+ regions to N-well 206 junction.

The second P+ region of the program PMOS transistor 220a also serves as the first P+ region of the access PMOS transistor 230a (e.g., they share a common P+ region). The access PMOS transistor 230a, in turn, includes a channel interposed between first and second P+ regions. Similar to the program PMOS transistor 220a. the P+ regions of the PMOS access transistor 230a may respectively include lighter doped regions on the channel side to prevent avalanche breakdown due to high electric fields associated with the edges of the P+ regions. The second P+ region of the access PMOS transistor 230a is electrically coupled to the V_array bias line via a contact 225a.

FIG. 2D illustrates a table depicting exemplary operation voltages for the exemplary EEPROM device 200 in accordance with an embodiment of the invention. The table depicts operation voltages for programming and reading a memory cell, erasing a block of memory cells, erasing a sector of memory cells, and performing a bit or byte erase operation. According to the table, the columns identify the operations, including program, read, block erase, sector erase, and bit/byte erase. The rows identify the operation voltages of the selected bit line (corresponding to the memory cell(s) on which the operation is to be performed), the unselected bit line (corresponding to memory cell(s) on which the operation is not to be performed), the selected word line, the unselected word line, the V array line, the selected erase line, the unselected erase line, the selected N-Well, and the unselected N-Well.

For example, programming a memory cell involves channel current induced, hot electron injection into the floating gate (FG) at the drain of the program PMOS transistor. The programming of a selected memory cell involves applying ground potential (e.g., ~0V) to the selected bit line and selected word line, and applying a programming voltage (e.g., ~3-6 Volts) on the V array line. The ground potential on the selected word line turns on the access PMOS transistor, causing the programming voltage Vprog (e.g., ~3-6 V) to be applied to the second P+ region of the program PMOS transistor. Since the first P+ region of the program PMOS transistor is at ground potential, the potential difference between the two P+ regions produces a programming channel current (~100 to 200 microamps). The channel current causes hot electron injection into the floating gate (FG).

To prevent the biasing of the program transistor into heavy conduction, which may reduce the programming efficiency, a positive voltage Vassist (e.g., ~0-3 Volts) is applied to the selected erase line. To prevent a forward biasing of the program PMOS transistor drain (D) to N-well junction, the programming voltage Vprog is also applied to the selected N-well.

To prevent disturbance to unselected memory cells in other word lines, the programming voltage Vprog is applied to the unselected word line. This in effect turns off the corresponding access PMOS transistor to prevent the voltage V_array to be applied to the second P+ region of the corresponding program PMOS transistor. To prevent disturbance to unselected memory cells in the selected word line, the unselected bit lines are floated so as to prevent the formation of a channel current through the corresponding program PMOS transistors. The erase line of the unselected memory cells is also raised to a positive voltage Vassist to further prevent the formation of any channel current through unselected program transistors. The N-Well of unselected memory cells along the selected word line is raised to Vprog to prevent a forwarding biasing of the unselected program transistor P+ to N-well junctions.

To perform a read operation on a selected memory cell, the voltage on the selected bit line is raised to Vcc (e.g., ~2 to 4 Volts), the voltage on the selected word line is set to approximately ground potential, and the voltage on the V_array line is set to Vread (e.g, Vcc-Vsd, where Vsd is approximately 0.5-1 Volt). The selected word line being at approximately ground potential causes the access transistor to turn on. This cause the voltage Vread on the V_array line to be applied to the second P+ region of the program transistor. Since the voltage (Vread) is lower than the voltage (Vcc) on the second P+ region of the program transistor, a small read current of approximately 10 to 100 microamps is formed.

To prevent a forward biasing of the program transistor P+ to N-well junctions of the two P+ regions, a positive voltage Vcc is applied to the selected N-Well. To prevent disturbance to unselected memory cells along the same bit line with their gate connected to other word lines, a positive voltage Vcc is applied to the unselected word line. This in effect turns off the corresponding access transistors. To prevent disturbance to unselected memory cells in the selected word line, the unselected bit lines are floated so as to prevented the formation of a channel current through the corresponding program PMOS transistors. The erase lines of the unselected memory cells are also raised to a positive voltage Vcc to further prevent the formation of any channel current through unselected programmed transistors. The N-Well of unselected memory cells along the selected word line is raised to Vcc to prevent a forward biasing of the unselected program transistor P+ to N-well junctions.

The erasing of one or more memory cells of the EEPROM device 200 is by electrons in the floating gate (FG) F-N tunneling to the N-diffusion region of the N-erase pocket. To perform a block erase operation for erasing an array of memory cells, the voltage on all of the erase lines is raised to Verase (e.g., ~7 to 10 Volts). All the other lines (bit lines, V_array, and N-wells) are substantially grounded. The voltages on word lines are generally not applicable since the access transistors are turned off because the N-Wells and V_array are grounded.

To perform a sector erase operation for erasing memory cells common to a word line, the voltage on the selected erase line is set to Verase to cause F-N tunneling of electrons from the floating gate (FG) to the diffusion region of the N-erase pocket. To increase coupling of the floating gate (FG) to ground potential, the P+ regions and the N-Well of the program transistors of the selected memory cells are substantially grounded. This is done by setting the corresponding bit line and N-well to ground potential. The bias line V_array, and the unselected lines (erase lines, bit lines, and N-Wells) and substantially grounded. The voltages on the selected and unselected word lines are generally not applicable since the corresponding access transistors are turned off because the corresponding N-Wells and V_array are grounded.

To perform a bit/byte erase operation, the voltage on the selected erase line is set to Verase to cause F-N tunneling of electrons from the floating gate (FG) to the diffusion region of the N-erase pocket. To increase coupling of the floating gate (FG) to ground potential, the P+ regions and N-wells of the program transistors of the selected memory cells are substantially grounded. This is done by setting the corresponding bit line and N-well to ground potential. To prevent erasure of unselected memory cells on the same word line as the selected memory cells, the unselected bit lines and unselected N-Wells are set to Vinh (e.g., ~3 to 6 Volts). This reduces the voltage potential between the floating gate (FG) of the unselected memory cells and the selected erase line to prevent F-N tunneling of electrons from the floating gate (FG) to the diffusion region of the N-erase pocket. All the word lines are biased at Vinh so as to turn off all access PMOS transistors and prevent a flow of current from unselected bit lines at Vinh to V_array which is floated.

If the bit or byte erase operation is not needed, the array can be simplified by connecting all the N-Wells in the array to a global N-Well bias terminal because the selected and unselected N-Wells are at the same potential for all other Program, Read and Erase operations.

Figure 3A:
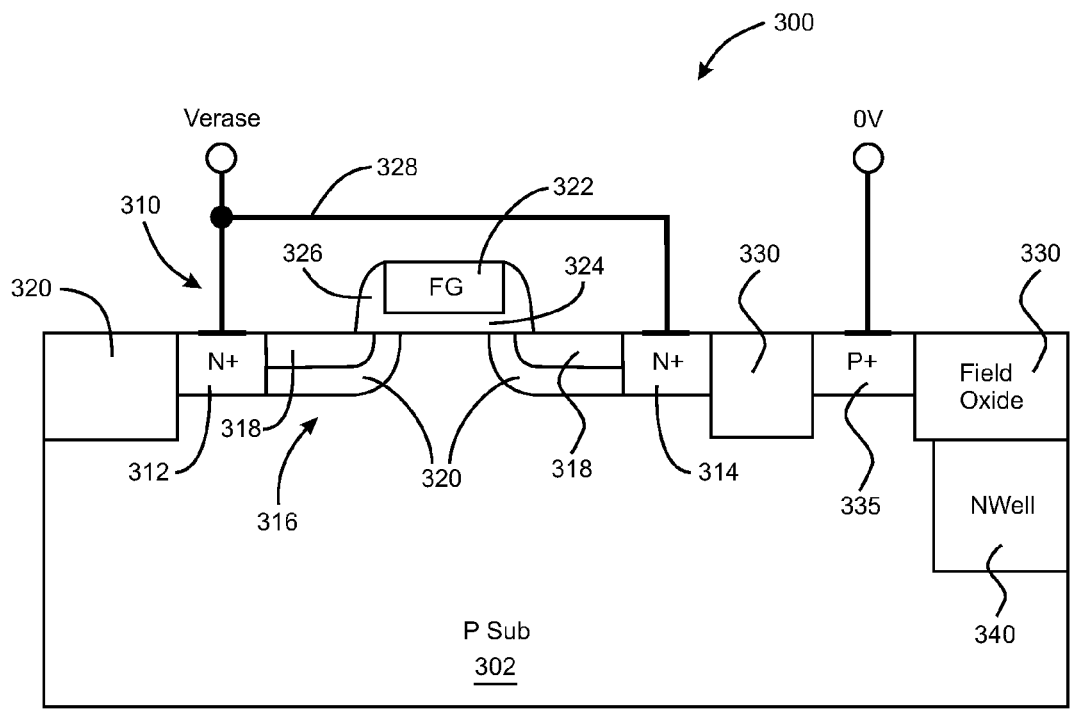
FIG. 3A illustrates a cross-sectional view of a first exemplary N-erase pocket in accordance with an embodiment of the invention.

FIG. 3A illustrates a cross-sectional view of an exemplary N-erase pocket 300 in accordance with an embodiment of the invention. The N-erase pocket 300 may be a detailed embodiment of any of the N-erase pockets 210a-d of the EEPROM memory device 200. Essentially, the N-erase pocket 300 is configured as an NMOS with the source (S) and drain (D) shorted together. In this embodiment, the source (S) and drain (D) are shorted by an electrically-conductive layer disposed above the substrate.

More specifically, the N-erase pocket 300 comprises an NMOS 310 formed in and above a p-doped substrate (P-substrate) 302. The NMOS 310, in turn, comprises a source region 312, a drain region 314, and a channel 316 situated between the source and drain regions 312 and 314. In this example, the source and drain regions 312 and 314 are relatively highly N+ doped regions formed within the P-substrate 302. The channel 316 comprises low voltage n-lightly doped diffusion (LV nLDD) regions 318 formed in a shallow region of the P-substrate 302, and adjacent to the source and drain regions 312 and 314, respectively. The channel 316 further comprises high voltage n-lightly doped diffusion (HV nLDD) regions 320 formed in a deeper region of the P-substrate 302, and adjacent to the source and drain regions 312 and 314, respectively.

The NMOS 310 further comprises a floating gate (FG) 322 disposed above the p-substrate 302, and separated from the channel 316 by a relatively thin oxide layer 324. The NMOS 310 may further include oxide spacers 326 situated over the P-substrate 302 and on both sides of the floating gate (FG) 322. The N-erase pocket 300 further comprises an electrically-conductive layer 328 (e.g., metal) disposed over the P-substrate 302, that is electrically connected to the source and drain regions 312 and 314; thereby, electrically shorting the regions 312 and 314 together. The NMOS 310 receives the erase voltage by way of the electrically-conductive layer 328.

A contact 335 (e.g., P+ doped region) may be formed within the P-substrate 302 to selectively bias the P-substrate 302 (e.g., applying ground potential to the P-substrate 302). Isolation structures, such as field oxides 330 may be formed on both sides of the NMOS 310 to isolate its active region from the active regions of other neighboring devices. Also shown, is the N-Well 340 in which the program and access PMOS transistors are formed as discussed with reference to EEPROM device 200.

Figure 3B:
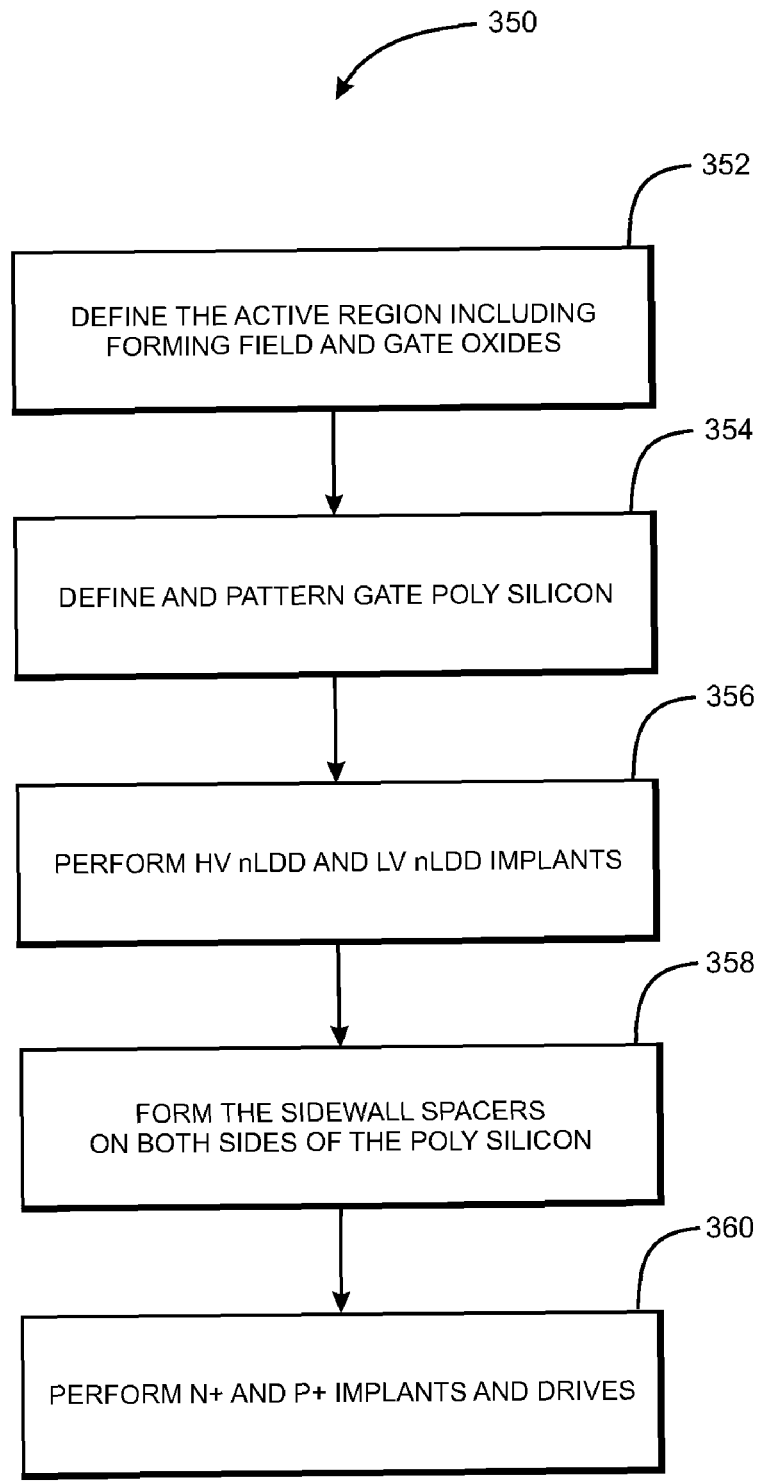
FIG. 3B illustrates a flow chart of an exemplary method of making the first exemplary N-erase pocket in accordance with an embodiment of the invention.

FIG. 3B illustrates a flow chart of a method 350 of making the exemplary N-erase pocket 300 in accordance with an embodiment of the invention. According to the method 350, the active region of the N-erase pocket 300 is defined including the formation of the field oxide and the gate oxide layer (block 352). Then, the gate polysilicon is defined and patterned to form the floating gate (block 354). Then, the HV nLDD and LV nLDD implants are performed (block 356). The HV nLDD reduces the electric fields near the edges of the source and drain regions to prevent hot electron injection into the gate oxide and the gate poly. The LV nLDD is doped much more heavily relative to the HV nLDD and thereby reduces the voltage dropped across the channel during an erase operation so that most of the erase voltage is generated across the gate oxide, to strip electrons from the floating gate so as to erase the memory cell. This has the advantage of lowering the erase voltage required to effectively erase the memory cell. Then, the side wall spacers are formed on both sides of the gate polysilicon (block 358). Then, the N+ and P+ implants are performed to form the source and drain regions, and the contact to the P-substrate (block 360).

Figure 4A:
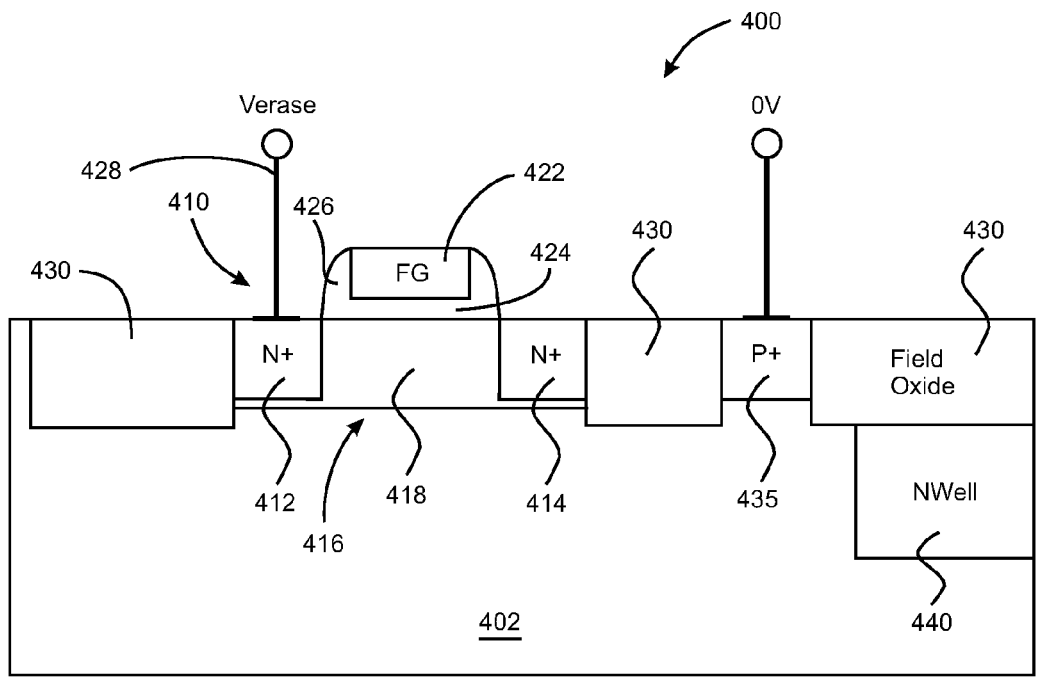
FIG. 4A illustrates a cross-sectional view of a second exemplary N-erase pocket in accordance with an embodiment of the invention.

FIG. 4A illustrates a cross-section view of an exemplary N-erase pocket 400 in accordance with an embodiment of the invention. The N-erase pocket 400 may be a detailed embodiment of any of the N-erase pockets 210a-d of the EEPROM memory device 200. Essentially, the N-erase pocket 400 is configured as an NMOS with the source (S) and drain (D) shorted together. In this embodiment, the source (S) and drain (D) are shorted within the substrate by a substantially uniformly doped diffusion region within the channel of the NMOS.

More specifically, the N-erase pocket 400 comprises an NMOS 410 formed with a p-doped substrate (P-substrate) 402. The NMOS 410, in turn, comprises a source region 412, a drain region 414, and a channel 416 situated between the source and drain regions 412 and 414. In this example, the source and drain regions 412 and 414 are N+ doped regions formed within the P-substrate 402. The channel 416 comprises a substantially uniformly doped N diffusion region 418 extending from the source region 412 to the drain region 414.

The NMOS 410 further comprises a floating gate (FG) 422 disposed above the p-substrate 402, and separated from the channel 416 by a relatively thin oxide layer 424. The NMOS 410 may further include oxide spacers 426 situated over the P-substrate 402 and on both sides of the floating gate (FG) 422. The N-erase pocket 400 further comprises an electrically-conductive layer 428 disposed over the P-substrate 402, and electrically connected directly to the source region 412. It shall be understood that the electrically-conductive layer 428 may be electrically connected directly to the drain region 414 instead of to the source contact region 412. The NMOS 410 receives the erase voltage by way of the electrically-conductive layer 428.

A contact 435 (e.g., P+ doped region) may be formed within the P-substrate 402 to selectively bias the P-substrate 402 (e.g., applying ground potential to the P-substrate 402). An isolation structure, such as a field oxide 430 may be formed on both sides of the NMOS 410 to isolate its active region from active regions of other neighboring devices. Also shown is the N-Well 440 in which the program and access PMOS transistors are formed, as discussed with reference to EEPROM device 200.

This particular N-erase pocket 400 may provide improved performance over the other N-erase pocket 300. For example, the diffusion region 418 has a larger area below the floating gate (FG) 422 that allows for a more uniform FN-tunneling of electrons during erasing of the memory cell. This has the advantage of lowering the voltage required to erase the memory cell. Additionally, the uniform diffusion region 418 eliminates n-p junction edges under the gate such as HV nLDD 320 to P substrate 302, and consequently, band-to-band tunneling of electrons from N erase pocket to P substrate, which would load the HV source supplying Verase with an undesirable large current. This has the advantage of reducing the load on the charge pump used for generating the erase voltage. The uniform diffusion region 418 also reduces trapping of hot carriers generated by the band-to-band tunneling in the oxide 424 which may, over time, reduce the erase capability as well as retention of the programmed or erased state of the memory cell.

Figure 4B:
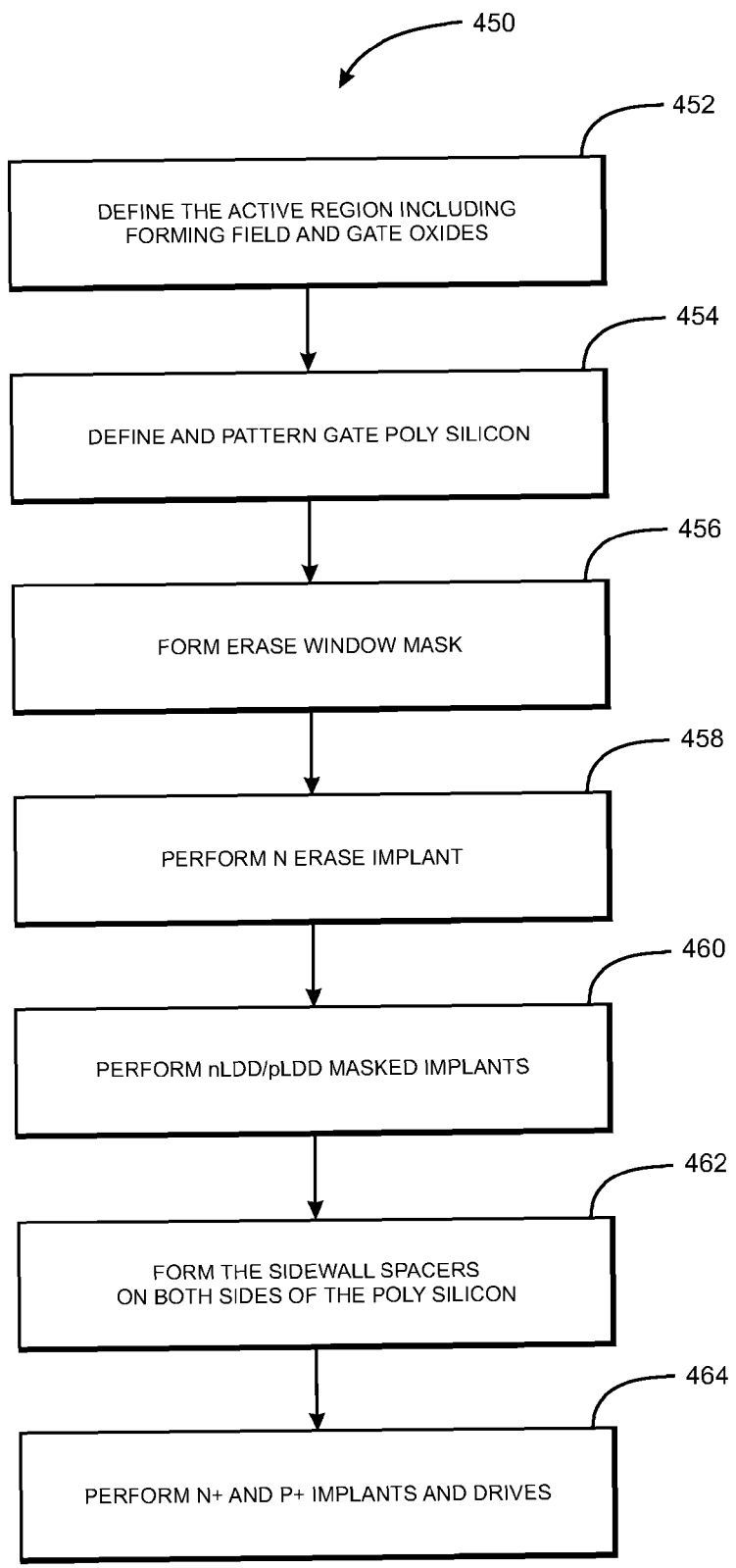
FIG. 4B illustrates a flow chart of an exemplary method of making the second exemplary N-erase pocket in accordance with an embodiment of the invention.

FIG. 4B illustrates a flow chart of a method 450 of making the exemplary N-erase pocket 400 in accordance with an embodiment of the invention. According to the method 450, the active region of the N-erase pocket 400 is defined including the formation of the field oxide and the gate oxide layer (block 452). Then, the gate polysilicon is defined and patterned to form the floating gate (block 454). Then, an erase window mask is formed to define the region for the substantially uniformly doped region (block 456). Then, an n-implant is performed on the erase window region to form the substantially uniformly doped region (block 458). As discussed above, the uniform doped region reduces band-to-band tunneling which causes leakage current. This allows the memory cell to retain the data for much longer periods. In addition, the uniform doped region reduces hole generation which may be trapped in the gate oxide 424 which may reduce the number of erase cycles that can be performed on the memory cell. Then, the nLDD and pLDD implants are performed (block 460). Then, the side wall spacers are formed on both sides of the gate polysilicon (block 462). Then, the N+ and P+ implants are performed to form the source and drain regions, and the contact to the P-substrate 402 (block 464).

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A memory device, comprising:
   a p-doped substrate;
   a plurality of electrically-conductive bit lines extending along a bit line direction;
   a plurality of electrically-conductive word lines extending along a word line direction;
   a plurality of electrically-conductive erase lines extending along said word line direction; and
   a plurality of memory cells arranged respectively along said bit lines and said word lines, wherein each memory cell comprises:
      a program PMOS transistor including a first gate, and first and second P+ regions formed within an n-doped well, wherein said first P+ region is electrically connected to a corresponding bit line;
      an access PMOS transistor including a second gate, and third and fourth P+ regions formed within said n-doped well, wherein said third P+ region is electrically connected to said second P+ region of said program PMOS transistor, and said second gate is electrically connected to a corresponding word line; and
      an n-doped erase pocket including a third gate, and first and second N+ regions electrically connected to a corresponding erase line, wherein said third gate is electrically connected to said first gate of said program PMOS transistor to form a floating gate, wherein said first and second N+ regions of said n-doped erase pocket are formed directly within said p-substrate.

2. The memory device of claim 1, wherein the program and access PMOS transistors of memory cells along a corresponding bit line are formed in a single continuous n-doped well.

3. The memory device of claim 1, wherein said first N+ region is electrically connected to said second N+ region of said n-doped erase pocket by way of an electrically-conductive layer formed above said p-doped substrate.

4. The memory device of claim 3, wherein said electrically-conductive layer comprises a metal.

5. The memory device of claim 3, wherein said corresponding erase line is electrically connected to said first and second N+ regions by way of said electrically-conductive layer.

6. The memory device of claim 1, wherein said first N+ region is electrically connected to said second N+ region of said n-doped erase pocket by way of a diffusion layer.

7. The memory device of claim 6, wherein said corresponding erase line is electrically connected directly to either said first N+ region or said second N+ region of said n-doped erase pocket.

8. The memory device of claim 1, further comprising a plurality of electrically-conductive bias lines extending along said word line direction, and wherein said fourth P+ region of said access PMOS transistor of each memory cell is electrically connected to a corresponding bias line.

9. A method of programming a selected memory cell comprising a selected program PMOS transistor, a selected access PMOS transistor connected in series with said program PMOS transistor, and a selected n-doped erase pocket formed directly within a p-substrate, sharing a floating gate with said program PMOS transistor, the method comprising:
   applying a substantially ground potential to a drain of said selected program PMOS transistor;
   applying a substantially ground potential to a gate of said selected access transistor; and
   applying a first bias voltage to a source of said selected access transistor.

10. The method of claim 9, wherein said first bias voltage is approximately three (3) to six (6) Volts.

11. The method of claim 9, further comprising applying a second bias voltage to first and second N+ regions of said selected n-doped erase pocket.

12. The method of claim 11, wherein said second bias voltage is approximately zero (0) to three (3) Volts.

13. The method of claim 11, wherein said second bias voltage is sufficient to minimally turn on said n-doped erase pocket.

14. The method of claim 9, wherein said selected program and access transistors are formed partially within an n-doped well, and further comprising applying a second bias voltage to said n-doped well.

15. The method of claim 14, wherein said second bias voltage is approximately three (3) to six (6) Volts.

16. The method of claim 9, further comprising biasing an unselected memory cell to prevent disturbance of data stored by said memory cell.

* * * * *